(12) United States Patent
Pagaila

(10) Patent No.: US 9,093,364 B2
(45) Date of Patent: Jul. 28, 2015

(54) INTEGRATED CIRCUIT PACKAGING SYSTEM WITH EXPOSED VERTICAL INTERCONNECTS AND METHOD OF MANUFACTURE THEREOF

(75) Inventor: Reza Argenty Pagaila, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 346 days.

(21) Appl. No.: 13/166,438

(22) Filed: Jun. 22, 2011

(65) Prior Publication Data

US 2012/0326281 A1    Dec. 27, 2012

(51) Int. Cl.

| | |
|---|---|
| H01L 23/48 | (2006.01) |
| H01L 23/52 | (2006.01) |
| H01L 29/40 | (2006.01) |
| H01L 23/00 | (2006.01) |
| H01L 23/31 | (2006.01) |
| H01L 25/10 | (2006.01) |
| H01L 25/16 | (2006.01) |
| H01L 23/498 | (2006.01) |
| H01L 21/48 | (2006.01) |

(52) U.S. Cl.
CPC ............ *H01L 24/20* (2013.01); *H01L 21/4853* (2013.01); *H01L 23/3128* (2013.01); *H01L 23/49816* (2013.01); *H01L 24/19* (2013.01); *H01L 24/73* (2013.01); *H01L 25/105* (2013.01); *H01L 25/16* (2013.01); *H01L 23/49838* (2013.01); *H01L 24/16* (2013.01); *H01L 24/48* (2013.01); *H01L 2224/12105* (2013.01); *H01L 2224/16225* (2013.01); *H01L 2224/16227* (2013.01); *H01L 2224/32145* (2013.01); *H01L 2224/32225* (2013.01); *H01L 2224/48145* (2013.01); *H01L 2224/48227* (2013.01); *H01L 2224/73204* (2013.01); *H01L 2225/107* (2013.01); *H01L 2225/1023* (2013.01); *H01L 2225/1041* (2013.01); *H01L 2225/1052* (2013.01); *H01L 2225/1058* (2013.01); *H01L 2924/014* (2013.01); *H01L 2924/01029* (2013.01); *H01L 2924/01327* (2013.01); *H01L 2924/15311* (2013.01); *H01L 2924/15331* (2013.01); *H01L 2924/19107* (2013.01)

(58) Field of Classification Search
CPC .......... H01L 2224/32145; H01L 2224/48145; H01L 2225/1058; H01L 23/3128; H01L 25/0657; H01L 25/16
USPC .......................... 257/775, 778, 787, E23.145
See application file for complete search history.

(56) References Cited

U.S. PATENT DOCUMENTS

| | | | |
|---|---|---|---|
| 6,787,392 B2 * | 9/2004 | Quah ............................ | 438/112 |
| 7,067,911 B1 * | 6/2006 | Lin et al. ...................... | 257/686 |
| 7,345,361 B2 | 3/2008 | Mallik et al. | |

(Continued)

OTHER PUBLICATIONS

Borowski, E.J., et al., Collins Dictionary of Mathematics, second edition, 2005, HarperCollins, p. 565.*

(Continued)

*Primary Examiner* — Howard Weiss
(74) *Attorney, Agent, or Firm* — Ishimaru & Associates LLP

(57) ABSTRACT

A method of manufacture of an integrated circuit packaging system includes: providing a substrate; attaching an integrated circuit to the substrate; attaching a vertical interconnect over the substrate; forming an encapsulation on the substrate and covering the vertical interconnect; and forming a rounded cavity, having a curved side, in the encapsulation with the vertical interconnect exposed in the rounded cavity.

20 Claims, 5 Drawing Sheets

(56) References Cited

U.S. PATENT DOCUMENTS

| | | |
|---|---|---|
| 7,550,317 B2 | 6/2009 | Kim |
| 7,714,453 B2 | 5/2010 | Khan et al. |
| 7,737,539 B2 | 6/2010 | Kwon et al. |
| 8,093,702 B2 * | 1/2012 | Lua et al. ............. 257/686 |
| 8,264,091 B2 * | 9/2012 | Cho et al. ............. 257/787 |
| 2007/0222008 A1 | 9/2007 | Chen et al. |
| 2008/0230887 A1 | 9/2008 | Sun et al. |
| 2011/0062574 A1 * | 3/2011 | Jang et al. ............. 257/686 |

OTHER PUBLICATIONS

Norman R. Mowrer, Polysiloxanes, Performance Coatings and Finishes, Nov. 2003, p. 11, Publisher: Ameron International, Published in: US.

* cited by examiner

INTEGRATED CIRCUIT PACKAGING SYSTEM WITH EXPOSED VERTICAL INTERCONNECTS AND METHOD OF MANUFACTURE THEREOF

TECHNICAL FIELD

The present invention relates generally to an integrated circuit packaging system, and more particularly to a system for an integrated circuit packaging system with pads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit system improved yield, low profile, and improved reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; attaching an integrated circuit to the substrate; attaching a vertical interconnect over the substrate; forming an encapsulation on the substrate and covering the vertical interconnect; and forming a rounded cavity, having a curved side, in the encapsulation with the vertical interconnect exposed in the rounded cavity.

The present invention provides an integrated circuit packaging system, including: a substrate; an integrated circuit attached to the substrate; a vertical interconnect over the substrate; and an encapsulation, having a rounded cavity with a curved side, on the substrate and covering the vertical interconnect with the vertical interconnect exposed in the rounded cavity.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
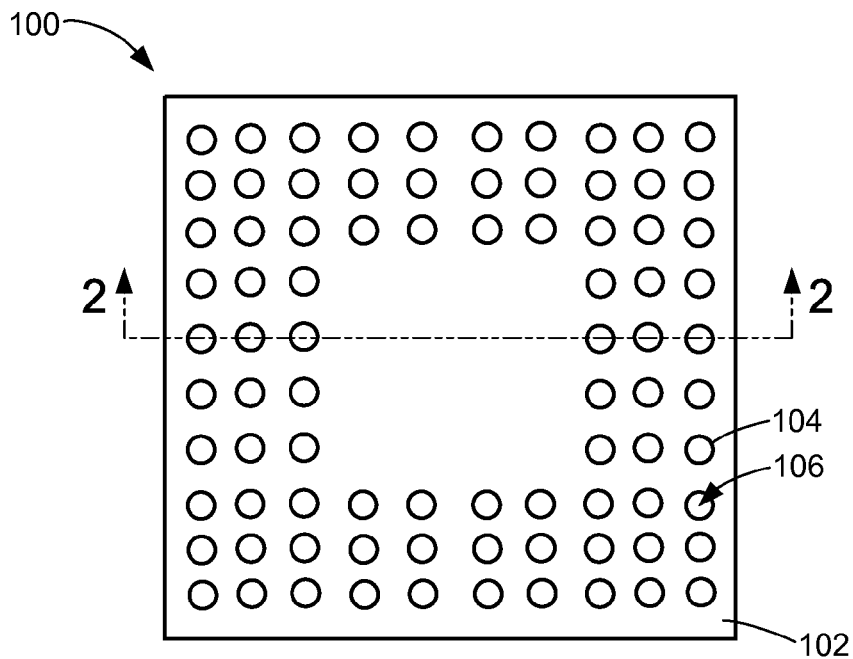
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit active side, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts an encapsulation 102. The encapsulation 102 is defined as a protective cover having electric and environmental insulating properties. As an example, the encapsulation 102 can be formed by molding an encapsulation material such as a molding compound or a ceramic material.

The encapsulation 102 can include rounded cavities 104. The rounded cavities 104 are defined as open spaces in a structure having sides that are curved or rounded. The rounded cavities 104 can be along a peripheral portion of the encapsulation 102. The peripheral portion is defined as a region adjacent to the perimeter of the encapsulation 102 and around an interior portion of the encapsulation 102.

The rounded cavities 104 can have cavity openings 106. The cavity openings 106 are defined as the external opening of a cavity located along the surface of a structure that forms the boundary for the external opening of the cavity. As an example, the cavity openings 106 can be along the surface of the encapsulation 102.

For illustrative purposes, the integrated circuit packaging system 100 is shown having the cavity openings 106 with a circular geometric shape, although it is understood that the cavity openings 106 can have a different geometric shape. For example, the cavity openings 106 can have a square, rectangular, triangular, or any other geometric shape.

Figure 2:
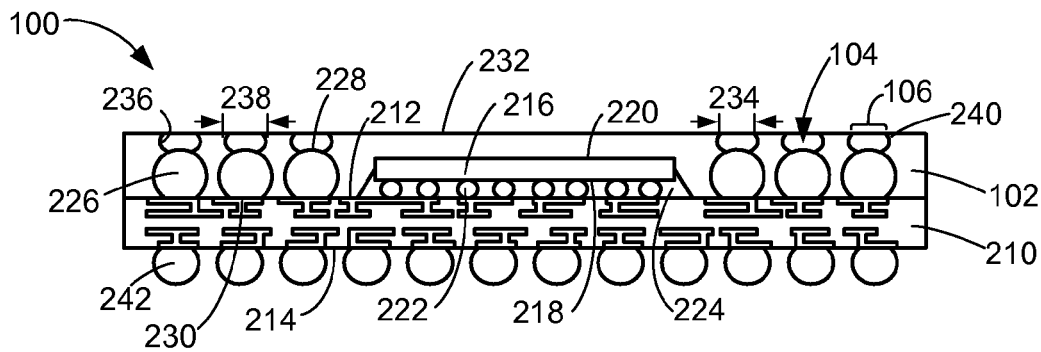
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts a substrate 210. The substrate 210 is defined as a rigid base structure that provides support and connectivity for other components and devices. As an example, the substrate 210 can be a laminated substrate or a ceramic substrate. As a further example, the laminated substrate can be a layered substrate having vias and intermetallic layers. As a specific example, the substrate 210 can be a printed circuit board. The substrate 210 can have a substrate first side 212 and a substrate second side 214.

An integrated circuit 216 can be attached to the substrate 210 along the substrate first side 212. The integrated circuit 216 is defined as semiconductor device. As an example, the integrated circuit 216 can be a semiconductor die, a thin semiconductor die, a wirebond die, or a flipchip. In the cross-sectional view, the integrated circuit 216 can be mounted on an interior portion of the substrate first side 212.

The integrated circuit 216 can have a circuit active side 218 and a circuit non-active side 220. The circuit active side 218 is defined as the side of the integrated circuit 216 having active circuitry fabricated thereon (not shown). The circuit active side 218 can face the substrate first side 212.

The circuit non-active side 220 is defined as the side of the integrated circuit 216 opposite the circuit active side 218. The circuit non-active side 220 can face away from the substrate first side 212.

The integrated circuit 216 can be attached to the substrate 210 with circuit interconnects 222. The circuit interconnects 222 are defined as conductive structures for providing electrical connection between elements, devices and other structures. As an example, the circuit interconnects 222 can be solder balls, solder bumps, or conductive bumps. The circuit interconnects 222 can connect the circuit active side 218 with the substrate first side 212.

An underfill 224 can be in and fill the space between the integrated circuit 216 and the substrate 210. The underfill 224 is defined as layer of material between a circuit device and a mounting support structure. For example, the underfill 224 can be an electrically insulating material, such as a non-conductive resin, including an epoxy resin, an adhesive material, or a thermally conductive material, such as an adhesive having thermally conductive properties. As a further example, the underfill 224 can provide mechanical connection between the integrated circuit 216 and the substrate 210.

The underfill 224 can surround and cover the circuit interconnects 222. The underfill 224 can provide structural and environmental protection for the circuit interconnects 222, such as moisture protect.

Vertical interconnects 226 can be attached to the substrate 210 along the substrate first side 212. The vertical interconnects 226 are defined as conductive structures embedded in and partially exposed from a recess of a protective structure for providing electrical connectivity to other devices or structures. As an example, the vertical interconnects 226 can be solder balls, solder bumps, conductive bumps, or conductive pillars. The vertical interconnects 226 can provide electrical connectivity to other devices or systems (not shown) mounted over the integrated circuit packaging system 100.

The vertical interconnects 226 can be laterally adjacent to the integrated circuit 216. For example, the vertical interconnects 226 can face a circuit vertical side of the integrated circuit 216.

The vertical interconnects 226 can be mounted on a peripheral portion of the substrate first side 212. The peripheral portion of the substrate first side 212 is defined as the region of the substrate first side 212 adjacent to the vertical side of the substrate 210.

An interconnect top 228 of the vertical interconnects 226 can be above the horizontal plane of the circuit non-active side 220. The interconnect top 228 of the vertical interconnects 226 is the portion of the vertical interconnects 226 that is opposite the substrate first side 212.

The vertical interconnects 226 can be connected to substrate pads 230. The substrate pads 230 are defined as conductive pads along the surface of a structure for providing electrical connection to the structure. The substrate pads 230 can be along the substrate first side 212.

For illustrative purposes, the substrate pads 230 are shown as coplanar with the substrate first side 212, although it is understood that the substrate pads 230 can have a different configuration. For example, the substrate pads 230 can be recessed from the substrate first side 212. As another example, the substrate pads 230 can be elevated above the substrate first side 212.

The encapsulation 102 can be on and cover the substrate first side 212. The encapsulation 102 can surround and cover the integrated circuit 216 and the portion of the underfill 224 protruding from between the integrated circuit 216 and the substrate 210. The vertical interconnects 226 can be partially embedded in the encapsulation 102.

The encapsulation 102 can have an encapsulation top side 232. The encapsulation top side 232 is defined as the side of the encapsulation 102 facing away from the substrate 210.

The rounded cavities 104 can be in the encapsulation 102 along the encapsulation top side 232. The rounded cavities 104 can be along a peripheral portion of the encapsulation top side 232. The peripheral portion of the encapsulation top side 232 can be the portion of the encapsulation top side 232 adjacent to a vertical side of the encapsulation 102.

A top portion of the vertical interconnects 226 can be exposed in the rounded cavities 104. The top portion of the vertical interconnects 226 includes the interconnect top 228. The exposed portion of the vertical interconnects 226 and the rounded cavities 104 can be above the horizontal plane of the circuit non-active side 220. The top portion of the vertical interconnect 226 has a convex shape. The convex top portion of the vertical interconnect 226 is exposed within the rounded cavities 104.

The rounded cavities 104 can have the cavity openings 106. The cavity openings 106 can be at the encapsulation top side 232. The cavity openings 106 can have an opening width 234. The opening width 234 is defined as the horizontal distance from one side of the cavity openings 106 to another side of the cavity openings 106.

The rounded cavities 104, formed in the encapsulation 102 between the exposed encapsulation top side 232 and the vertical interconnects 226, can have curved sides 236. The curved sides 236 are defined as the portion of the rounded cavities 104 in the encapsulation 102 between the cavity openings 106 and the exposed convex top portion of the vertical interconnects 226. The cavity openings 106 can be positioned directly above the vertical interconnects 226. The convex top portion of the vertical interconnects 226 can be exposed through the cavity openings 106. The curved sides 236 can have a rounded contoured. The curved sides 236 can be curved into the encapsulation 102.

The rounded cavities 104 can have a toroid shape, formed below the encapsulation top side 232, with a cavity width 238. The cavity width 238 is defined as the horizontal distance measured at the widest part of the rounded cavities 104. For example, the cavity width 238 can be measured where the curved sides 236 are furthest apart from each other. The cavity width 238 can be greater than the opening width 234 of the cavity openings 106. The convex top portion of the vertical interconnect 226 is exposed within the cavity opening 106 formed through the center of the toroid shape of the rounded cavities 104.

The encapsulation 102 can include a cavity overhang 240 along the encapsulation top side 232 and at the cavity openings 106. The cavity overhang 240 is defined as the portion of the encapsulation 102 extending over the rounded cavities 104. The cavity overhand 240 is directly over the convex top portion of the vertical interconnect 226.

The cavity overhang 240 and the rounded cavities 104 having the curved sides 236 can provide a locking function between the vertical interconnects 226 and other interconnect structures (not shown). For example, the other interconnect structures attached to devices or systems (not shown) that are mounted over the integrated circuit packaging system 100 can fill the rounded cavities 104 and held in position by the cavity overhang 240.

The exposed portion of the vertical interconnects 226 and the curved sides 236 of the rounded cavities 104 can have the characteristics of a sacrificial material removed. As a further example, the sacrificial material can be a material that is different in composition from the encapsulation 102 and the vertical interconnects 226 that enable the sacrificial material to be selectively removed without removing the encapsulation 102 or the vertical interconnects 226. In a further example, the characteristics of a sacrificial material removed can include chemical residue from the removal process, surface etch marks, or other physical features or artifacts resulting from material removal. The curved sides 236 can have a shape determined by the sacrificial material prior to removal. The curved sides 236 and the exposed portion of the vertical interconnects 226 do not have surface contours or shapes resembling a surface formed by removal of material.

External interconnects 242 can be attached to the substrate second side 214. The external interconnects 242 are defined as conductive structures for providing electrical connectivity to other devices or structures. As an example, the external interconnects 242 can be solder balls, solder bumps, conductive bumps, or conductive pillars. The external interconnects 242 can provide connectivity to the next system level down (not shown).

It has been discovered that the present invention provides the integrated circuit packaging system 100 with the cavity overhang 240 and the rounded cavities 104 having reliable connectivity. The cavity overhang 240 and the rounded cavities 104 provides the locking function when the vertical interconnects 226 is connected to other devices or systems, thus providing reliable connectivity.

Figure 3:
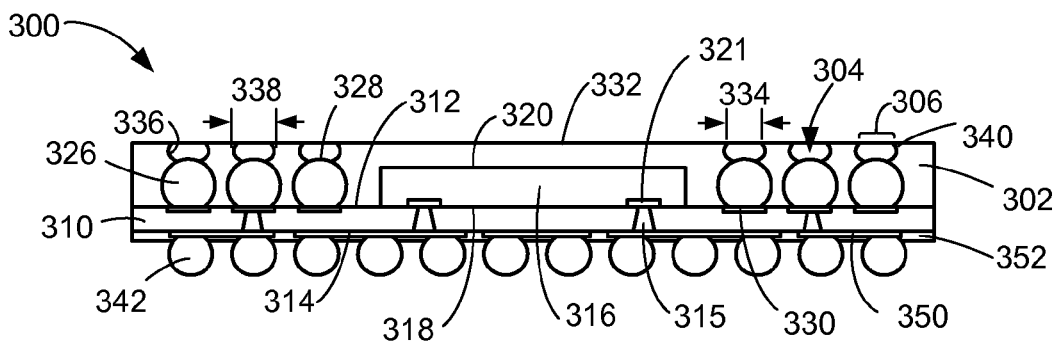
FIG. 3 is a cross-sectional view of an integrated circuit packaging system as exemplified by the line 2-2 of FIG. 1 in a second embodiment of the present invention.

Referring now to FIG. 3, therein is shown a cross-sectional view of an integrated circuit packaging system 300 as exemplified by the line 2-2 of FIG. 3 in a second embodiment of the present invention. The cross-sectional view depicts a substrate 310. The substrate 310 is defined as a rigid base structure that provides support and connectivity for other components and devices. As an example, the substrate 310 can be a semiconductor substrate, such as a silicon substrate, or an active substrate. As a further example, the substrate can have active circuitry fabricated thereon (not shown). The substrate 310 can have a substrate first side 312 and a substrate second side 314.

The substrate 310 can include through vias 315. The through vias 315 are defined as through holes, filled with conductive material, from one surface to an opposing surface of a support structure. For example, the through vias 315 can be in the substrate 310, from the substrate first side 312 to the substrate second side 314. As a specific example, the through vias 315 can be through silicon vias filled with a conductive material, such as a metal or metal alloy.

An integrated circuit 316 can be attached to the substrate 310 along the substrate first side 312. The integrated circuit 316 is defined as semiconductor device. As an example, the integrated circuit 316 can be a semiconductor die, a thin semiconductor die, a wirebond die, or a flipchip. In the cross-sectional view, the integrated circuit 316 can be mounted on an interior portion of the substrate first side 312.

The integrated circuit 316 can have a circuit active side 318 and a circuit non-active side 320. The circuit active side 318 is defined as the side of the integrated circuit 316 having active circuitry (not shown) fabricated thereon. The circuit active side 318 can face the substrate first side 312.

The circuit non-active side 320 is defined as the side of the integrated circuit 316 opposite the circuit active side 318. The circuit non-active side 320 can face away from the substrate first side 312.

Circuit pads 321 can be along the circuit active side 318. The circuit pads 321 are defined as conductive pads for providing electrical connectivity to a circuit device. The circuit pads 321 can be connected to the through vias 315 exposed along the substrate first side 312.

Vertical interconnects 326 can be attached to the substrate 310 along the substrate first side 312. The vertical interconnects 326 are defined as conductive structures embedded in and partially exposed from a recess of a protective structure for providing electrical connectivity to other devices or structures. As an example, the vertical interconnects 326 can be solder balls, solder bumps, conductive bumps, or conductive pillars. The vertical interconnects 326 can provide electrical connectivity to other devices or systems (not shown) mounted over the integrated circuit packaging system 300.

The vertical interconnects 326 can be laterally adjacent to the integrated circuit 316. For example, the vertical interconnects 326 can face a circuit vertical side of integrated circuit 316.

The vertical interconnects 326 can be mounted on a peripheral portion of the substrate first side 312. The peripheral portion of the substrate first side 312 is defined as the region of the substrate first side 312 adjacent to the vertical side of the substrate 310.

An interconnect top 328 of the vertical interconnects 326 can be above the horizontal plane of the circuit non-active side 320. The interconnect top 328 of the vertical interconnects 326 is the portion of the vertical interconnects 326 that is opposite the substrate first side 312.

The vertical interconnects 326 can be connected to substrate pads 330. The substrate pads 330 are defined as conductive pads along the surface of a structure for providing electrical connection to the structure. The substrate pads 330 can be along the substrate first side 312.

For illustrative purposes, the substrate pads 330 are shown as coplanar with the substrate first side 312, although it is understood that the substrate pads 330 can have a different configuration. For example, the substrate pads 330 can be recessed from the substrate first side 312. As another example, the substrate pads 330 can be elevated above the substrate first side 312.

An encapsulation 302 can be on and cover the substrate first side 312. The encapsulation 302 is defined as a protective cover having electric and environmental insulating properties. As an example, the encapsulation 302 can be formed by molding an encapsulation material such as a molding compound or a ceramic material. The encapsulation 302 can surround and cover the integrated circuit 316. The vertical interconnects 326 can be partially embedded in the encapsulation 302.

The encapsulation 302 can have an encapsulation top side 332. The encapsulation top side 332 is defined as the side of the encapsulation 302 facing away from the substrate 310.

The encapsulation 302 can include rounded cavities 304. The rounded cavities 304 are defined as open spaces in a structure having sides that are curved or rounded. The rounded cavities 304 can be in the encapsulation 302 along the encapsulation top side 332. The rounded cavities 304 can be along a peripheral portion of the encapsulation top side 332. The peripheral portion of the encapsulation top side 332 can be the portion of the encapsulation top side 332 adjacent to a vertical side of the encapsulation 302.

A top portion of the vertical interconnects 326 can be exposed in the rounded cavities 304. The top portion of the vertical interconnects 326 includes the interconnect top 328. The exposed portion of the vertical interconnects 326 and the rounded cavities 304 can be above the horizontal plane of the circuit non-active side 320.

The rounded cavities 304 can have cavity openings 306. The cavity openings 306 are defined as the external opening of a cavity located along the surface of a structure that forms the boundary for the external opening of the cavity. As an example, the cavity openings 306 can be along the surface of the encapsulation 302.

The cavity openings 306 can be at the encapsulation top side 332. The cavity openings 306 can have an opening width 334. The opening width 334 is defined as the horizontal distance from one side of the cavity openings 306 to another side of the cavity openings 306.

The rounded cavities 304 can have curved sides 336. The curved sides 336 are defined as the portion of the rounded cavities 304 in the encapsulation 302 between the cavity openings 306 and the exposed portion of the vertical interconnects 326. The curved sides 336 can have a rounded contoured. The curved sides 336 can be curved into the encapsulation 302.

The rounded cavities 304 can have a cavity width 338. The cavity width 338 is defined as the horizontal distance measured at the widest part of the rounded cavities 304. For example, the cavity width 338 can be measured where the curved sides 336 are furthers apart from each other. The cavity width 338 can be greater than the opening width 334 of the cavity openings 306.

The encapsulation 302 can include a cavity overhang 340 along the encapsulation top side 332 and at the cavity openings 306. The cavity overhang 340 is defined as the portion of the encapsulation 302 extending over the rounded cavities 304.

The cavity overhang 340 and the rounded cavities 304 having the curved sides 336 can provide a locking function between the vertical interconnects 326 and other interconnect structures (not shown). For example, the other interconnect structures attached to devices or systems (not shown) that are mounted over the integrated circuit packaging system 300 can fill the rounded cavities 304 and held in position by the cavity overhang 340.

The exposed portion of the vertical interconnects 326 and the curved sides 336 of the rounded cavities 304 can have the characteristics of a sacrificial material removed. As a further example, the sacrificial material can be a material that is different in composition from the encapsulation 302 and the vertical interconnects 326 that enable the sacrificial material to be selectively removed without removing the encapsulation 302 or the vertical interconnects 326. In a further example, the characteristics of a sacrificial material removed can include chemical residue from the removal process, surface etch marks, or other physical features or artifacts resulting from material removal. The curved sides 336 can have a shape determined by the sacrificial material prior to removal. The curved sides 336 and the exposed portion of the vertical interconnects 326 do not have surface contours or shapes resembling a surface formed by removal of material.

Redistribution interconnects 350 can be along the substrate second side 314. The redistribution interconnects 350 are defined as conductive interconnects along a surface of structure or device for providing electrical connection and routing electrical signals. As an example, the redistribution interconnects 350 can be made from a conductive material, such as copper, a copper alloy, gold, a gold alloy, nickel, a nickel alloy, or other alloys. The redistribution interconnects 350 can be connected to the substrate pads 330 with the through vias 315.

A protective layer 352 can be on the substrate second side 314 and can cover portions of the redistribution interconnects 350. The protective layer 352 is defined as a layer of material to cover and protect circuitry and connective structures. For example, the protective layer 352 can be a dielectric layer or a polymer layer. The redistribution interconnects 350 can be exposed from the protective layer 352.

External interconnects 342 can be attached to the portions of the redistribution interconnects 350 exposed from the protective layer 352. The external interconnects 342 are defined as conductive structures for providing electrical connectivity to other devices or structures. As an example, the external interconnects 342 can be solder balls, solder bumps, conductive bumps, or conductive pillars. The external interconnects 342 can provide connectivity to the next system level down (not shown).

The integrated circuit packaging system 300 can provide an active substrate. The active substrate is defined as a structure, having embedded active devices, which can function as a base for mounting other devices or components. For example, the integrated circuit packaging system 300 can be a wafer level chip scale package.

It has been discovered that the present invention provides the integrated circuit packaging system 300 with the cavity overhang 340 and the rounded cavities 304 having reliable connectivity. The cavity overhang 340 and the rounded cavities 304 provides the locking function when the vertical interconnects 326 is connected to other devices or systems, thus providing reliable connectivity.

Figure 4:
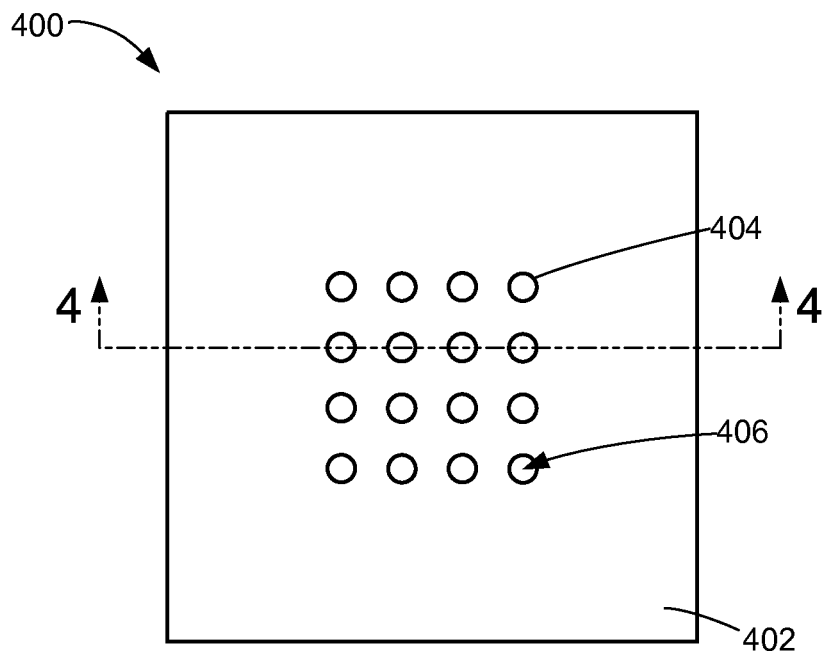
FIG. 4 is a top view of an integrated circuit packaging system in a third embodiment of the present invention.

Referring now to FIG. 4, therein is shown a top view of an integrated circuit packaging system 400 in a third embodiment of the present invention. The top view depicts an encapsulation 402. The encapsulation 402 is defined as a protective cover having electric and environmental insulating properties. As an example, the encapsulation 402 can be formed by molding an encapsulation material such as a molding compound or a ceramic material.

The encapsulation 402 can include rounded cavities 404. The rounded cavities 404 are defined as open spaces in a structure having sides that are curved or rounded. The rounded cavities 404 can be at an interior portion of the encapsulation 402.

The rounded cavities 404 can have cavity openings 406. The cavity openings 406 are defined as the external opening of a cavity located along the surface of a structure that forms the boundary for the external opening of the cavity. As an example, the cavity openings 406 can be along the surface of the encapsulation 402.

For illustrative purposes, the integrated circuit packaging system 400 is shown having the cavity openings 406 with a circular geometric shape, although it is understood that the cavity openings 406 can have a different geometric shape. For example, the cavity openings 406 can have a square, rectangular, triangular, or any other geometric shape.

Figure 5:
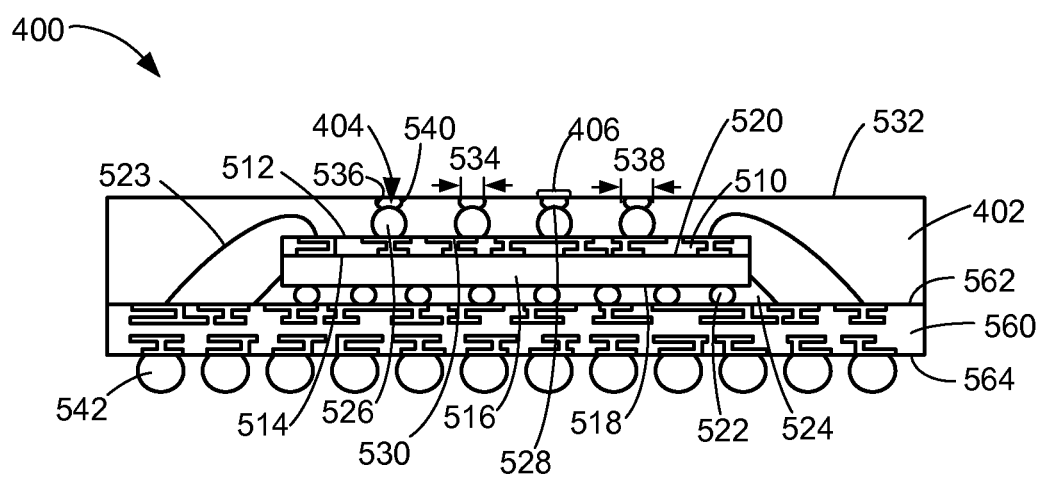
FIG. 5 is a cross-sectional view of the integrated circuit packaging system along line 5-5 of FIG. 4.

Referring now to FIG. 5, therein is shown a cross-sectional view of the integrated circuit packaging system 400 along line 5-5 of FIG. 4. The cross-sectional view depicts a carrier 560. The carrier is defined as a rigid base structure that provides support and connectivity for other components and devices. As an example, the carrier 560 can be a laminated carrier, a semiconductor carrier, a ceramic carrier, or a metallic carrier. As a further example, the laminated carrier can be a layered carrier having vias and intermetallic layers. As a specific example, the carrier 560 can be a printed circuit board. The carrier 560 can have a carrier first side 562 and a carrier second side 564.

An integrated circuit 516 can be attached to the carrier 560 along the carrier first side 562. The integrated circuit 516 is defined as semiconductor device. As an example, the integrated circuit 516 can be a semiconductor die, a thin semiconductor die, or a flipchip. In the cross-sectional view, the integrated circuit 516 can be mounted on an interior portion of the carrier first side 562.

The integrated circuit 516 can have a circuit active side 518 and a circuit non-active side 520. The circuit active side 518 is defined as the side of the integrated circuit 516 having active circuitry fabricated thereon (not shown). The circuit active side 518 can face the carrier first side 562.

The circuit non-active side 520 is defined as the side of the integrated circuit 516 opposite the circuit active side 518. The circuit non-active side 520 can face away from the carrier first side 562.

The integrated circuit 516 can be attached to the carrier 560 with circuit interconnects 522. The circuit interconnects 522 are defined as conductive structures for providing electrical connection between elements, devices and other structures. As an example, the circuit interconnects 522 can be solder balls, solder bumps, or conductive bumps. The circuit interconnects 522 can connect the circuit active side 518 with the carrier first side 562.

An underfill 524 can be in and fill the space between the integrated circuit 516 and the carrier 560. The underfill 524 is defined as layer of material between a circuit device and a mounting support structure. For example, the underfill 524 can be an electrically insulating material, such as a non-conductive resin, including an epoxy resin, an adhesive material, or a thermally conductive material, such as an adhesive having thermally conductive properties. As a further example, the underfill 524 can provide mechanical connection between the integrated circuit 516 and the carrier 560.

The underfill 524 can surround and cover the circuit interconnects 522. The underfill 524 can provide structural and environmental protection for the circuit interconnects 522, such as moisture protect.

A substrate 510 can be mounted over the integrated circuit 516. The substrate 510 is defined as a rigid structure that provides support and connectivity for other components and devices. As an example, the substrate 510 can be a laminated substrate or a ceramic substrate. As a further example, the laminated substrate can be a layered substrate having vias and intermetallic layers. As a specific example, the substrate 510 can be a printed circuit board.

The substrate 510 can have a substrate first side 512 and a substrate second side 514. The substrate first side 512 is defined as the side of the substrate 510 facing away from the integrated circuit 516 and the carrier 560.

The substrate second side 514 is defined as the side opposite the substrate first side 512. The substrate second side 514 can face the integrated circuit 516 and the carrier 560. The circuit non-active side 520 of the integrated circuit 516 can be attached to the substrate second side 514.

An internal interconnects 523 can connect the carrier 560 and the substrate 510. The internal interconnects 523 is a conductive interconnect for electrically connecting structures within a packaging system. As an example, the internal interconnects 523 can be a bond wire, or a ribbon bond wire. The internal interconnects 523 can connect the substrate first side 512 and the carrier first side 562.

Vertical interconnects 526 can be attached to the substrate 510 along the substrate first side 512. The vertical interconnects 526 are defined as conductive structures embedded in and partially exposed from a recess of a protective structure for providing electrical connectivity to other devices or structures. As an example, the vertical interconnects 526 can be solder balls, solder bumps, conductive bumps, or conductive pillars. The vertical interconnects 526 can provide electrical connectivity to other devices or systems (not shown) mounted over the integrated circuit packaging system 400.

An interconnect top 528 of the vertical interconnects 526 can be above the horizontal plane of the circuit non-active side 520. The interconnect top 528 of the vertical interconnects 526 is the portion of the vertical interconnects 526 that is opposite the substrate first side 512.

The vertical interconnects 526 can be connected to substrate pads 530. The substrate pads 530 are defined as conductive pads along the surface of a structure for providing electrical connection to the structure. The substrate pads 530 can be along the substrate first side 512.

The encapsulation 402 can be on and cover the substrate first side 512 and the carrier first side 562. The encapsulation 402 can surround and cover the integrated circuit 516 and the portion of the underfill 524 protruding from between the integrated circuit 516 and the substrate 510. The vertical interconnects 526 can be partially embedded in the encapsulation 402.

The encapsulation 402 can have an encapsulation top side 532. The encapsulation top side 532 is defined as the side of the encapsulation 402 facing away from the substrate 510.

The rounded cavities 404 can be in the encapsulation 402 along the encapsulation top side 532. The rounded cavities 404 can be along an interior portion of the encapsulation top side 532.

A top portion of the vertical interconnects 526 can be exposed in the rounded cavities 404. The top portion of the vertical interconnects 526 includes the interconnect top 528. The exposed portion of the vertical interconnects 526 and the rounded cavities 404 can be above the horizontal plane of the circuit non-active side 520.

The rounded cavities 404 can have the cavity openings 406. The cavity openings 406 can be at the encapsulation top side 532. The cavity openings 406 can have an opening width 534. The opening width 534 is defined as the horizontal distance from one side of the cavity openings 406 to another side of the cavity openings 406.

The rounded cavities 404 can have curved sides 536. The curved sides 536 are defined as the portion of the rounded cavities 404 in the encapsulation 402 between the cavity openings 406 and the exposed portion of the vertical interconnects 526. The curved sides 536 can have a rounded contoured. The curved sides 536 can be curved into the encapsulation 402.

The rounded cavities 404 can have a cavity width 538. The cavity width 538 is defined as the horizontal distance measured at the widest part of the rounded cavities 404. For example, the cavity width 538 can be measured where the curved sides 536 are furthers apart from each other. The cavity width 538 can be greater than the opening width 534 of the cavity openings 406.

The encapsulation 402 can include a cavity overhang 540 along the encapsulation top side 532 and at the cavity openings 406. The cavity overhang 540 is defined as the portion of the encapsulation 402 extending over the rounded cavities 404.

The cavity overhang 540 and the rounded cavities 404 having the curved sides 536 can provide a locking function between the vertical interconnects 526 and other interconnect structures (not shown). For example, the other interconnect structures attached to devices or systems (not shown) that are mounted over the integrated circuit packaging system 400 can fill the rounded cavities 404 and held in position by the cavity overhang 540.

The exposed portion of the vertical interconnects 526 and the curved sides 536 of the rounded cavities 404 can have the characteristics of a sacrificial material removed. As a further example, the sacrificial material can be a material that is different in composition from the encapsulation 402 and the vertical interconnects 526 that enable the sacrificial material to be selectively removed without removing the encapsulation 402 or the vertical interconnects 526. In a further example, the characteristics of a sacrificial material removed can include chemical residue from the removal process, surface etch marks, or other physical features or artifacts resulting from material removal. The curved sides 536 can have a shape determined by the sacrificial material prior to removal. The curved sides 536 and the exposed portion of the vertical interconnects 526 do not have surface contours or shapes resembling a surface formed by removal of material.

External interconnects 542 can be attached to the carrier second side 564. The external interconnects 542 are defined as conductive structures for providing electrical connectivity to other devices or structures. As an example, the external interconnects 542 can be solder balls, solder bumps, conductive bumps, or conductive pillars. The external interconnects 542 can provide connectivity to the next system level down (not shown).

It has been discovered that the present invention provides the integrated circuit packaging system 400 with the cavity overhang 540 and the rounded cavities 404 having reliable connectivity. The cavity overhang 540 and the rounded cavities 404 provides the locking function when the vertical interconnects 526 is connected to other devices or systems, thus providing reliable connectivity.

Figure 6:
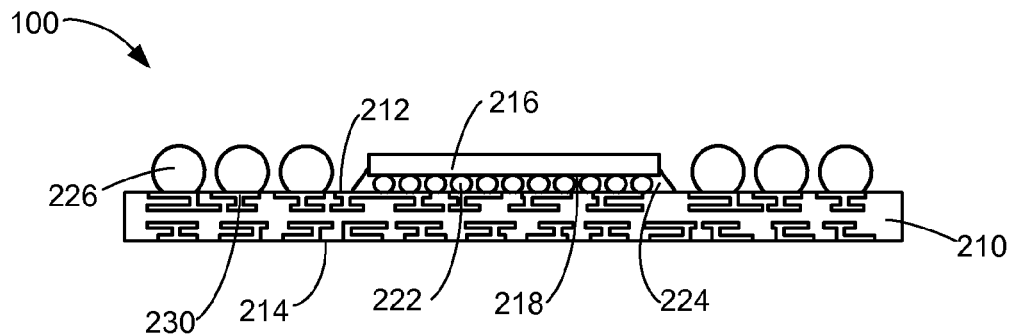
FIG. 6 is a cross-sectional view of the integrated circuit packaging system as exemplified by line 2-2 of FIG. 1 in an attaching phase of manufacture.

Referring now to FIG. 6, therein is shown a cross-sectional view of the integrated circuit packaging system 100 as exemplified by line 2-2 of FIG. 1 in an attaching phase of manufacture. The cross-sectional view depicts the substrate 210 having the substrate first side 212 and the substrate second side 214.

The integrated circuit 216 can be attached to the substrate first side 212 with the circuit interconnects 222. The underfill 224 can be formed between substrate first side 212 and the circuit active side 218 of the integrated circuit 216.

The vertical interconnects 226 can be attached laterally adjacent to the integrated circuit 216. The vertical interconnects 226 can be attached on the peripheral portion of the substrate first side 212.

Figure 7:
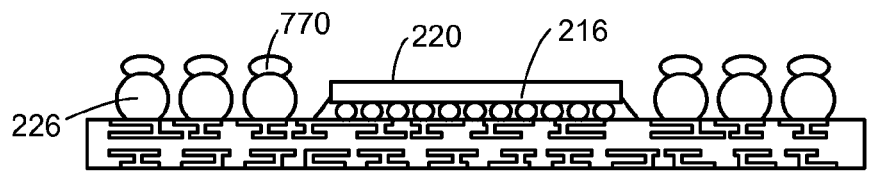
FIG. 7 is the structure of FIG. 6 in a forming phase.

Referring now to FIG. 7, therein is shown the structure of FIG. 6 in a forming phase. An interconnect cap 770 can be applied on the top portion of the vertical interconnects 226. The interconnect cap 770 is defined as a sacrificial cover. The interconnect cap 770 can be formed above the horizontal plane of the circuit non-active side 220 of the integrated circuit 216.

As an example, the interconnect cap 770 can be formed from a material capable of resisting degradation or decomposition, and maintaining physical shape at high temperatures. High temperatures are defined as a temperature used during molding of a protective cover. As a specific example, the interconnect cap 770 can be formed from a cured or partially cured polymer material capable of withstanding high temperatures, such as a polysiloxane, a polyimide, or a phenolic resin. As a further example, the material used to form the interconnect cap 770 can have a viscosity capable of resisting flow or deformation subsequent to application on the vertical interconnects 226.

The interconnect cap 770 can be formed in a number of different ways. For example, the material used to form the interconnect cap 770 can be applied to the top portion of the vertical interconnects 226 and partially or fully cured. As a specific example the interconnect cap 770 can be formed by screen printing the material used to form the interconnect cap 770 on the top portion of the vertical interconnects 226. In another specific example, the structure of FIG. 6 can be inverted and the top portion of the vertical interconnects 226 can be dipped into a vat or bath of the material used to form the interconnect cap 770.

Figure 8:
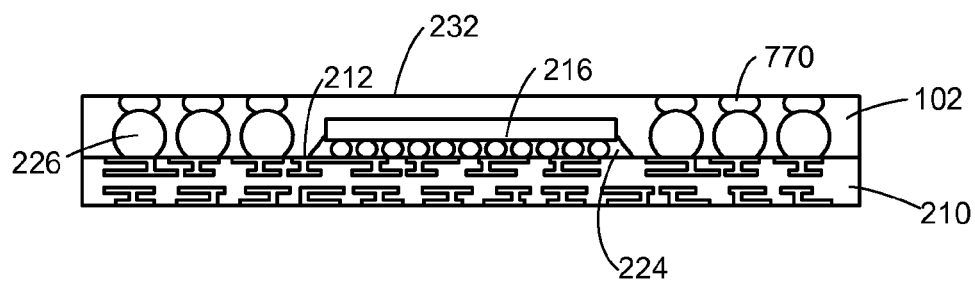
FIG. 8 is the structure of FIG. 7 in a covering phase.

Referring now to FIG. 8, therein is shown the structure of FIG. 7 in a covering phase. The encapsulation 102 can be formed over the structure of FIG. 7. The encapsulation 102 can be formed on the substrate first side 212 of the substrate 210.

The encapsulation 102 can be formed to surround and cover the integrated circuit 216 and the portion of the underfill 224 protruding from between the integrated circuit 216 and the substrate 210. The vertical interconnects 226 can be embedded in the encapsulation 102. The interconnect cap 770 can be partially covered by the encapsulation 102.

The encapsulation 102 can have the encapsulation top side 232. The encapsulation top side 232 can be formed facing away from the substrate first side 212. The interconnect cap 770 can be exposed from the encapsulation 102 along the encapsulation top side 232.

Figure 9:
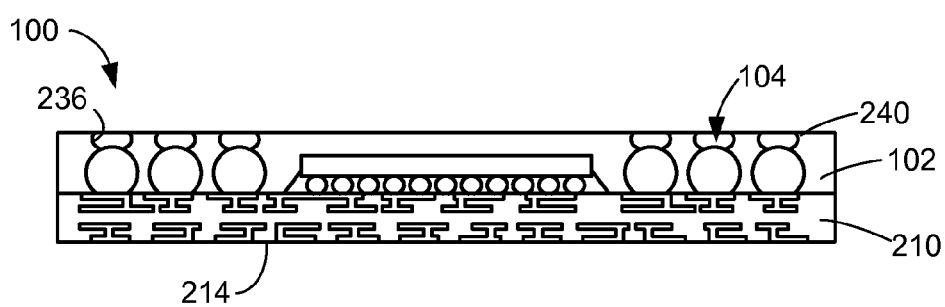
FIG. 9 is the structure of FIG. 8 in forming the integrated circuit packaging system of FIG. 1.

Referring now to FIG. 9, therein is shown the structure of FIG. 8 in forming the integrated circuit packaging system 100 of FIG. 1. The interconnect cap 770 of FIG. 8 can be removed to form the rounded cavities 104, having the curved sides 236, and the cavity overhang 240. The curved sides 236 can have matching the surface contours of the interconnect cap 770. Removing the interconnect cap 770 can expose the top portion of the vertical interconnects 226 in the rounded cavities 104.

The interconnect cap 770 can be selectively removed. Selective removal of the interconnect cap 770 does not remove or significantly alter the encapsulation 102 or the vertical interconnects 226.

The interconnect cap 770 can be removed in a number of different ways. For example, the interconnect cap 770 can be removed by an etching process, such as wet etching or chemical etching, or other methods, such as through exposure to ultraviolet light, or heat treatment. Removing of the interconnect cap 770

The external interconnects 242 of FIG. 2 can be attached to the substrate 210 along the substrate second side 214. Removing the interconnect cap 770 and attaching the external interconnects 242 can form the integrated circuit packaging system 100.

Figure 10:
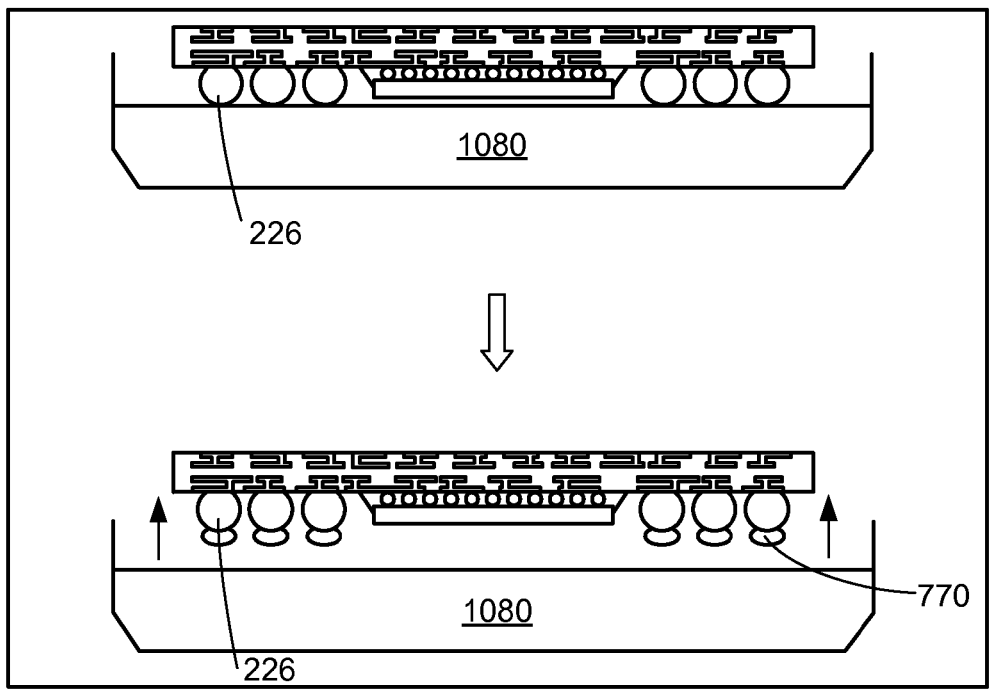
FIG. 10 is a first example in forming the interconnect cap of FIG. 7.

Referring now to FIG. 10, therein is shown a first example in forming the interconnect cap 770 of FIG. 7. The first example depicts the structure of FIG. 6. The structure of FIG. 6 can be inverted over a bath 1080 of the material used to apply the interconnect cap 770 of FIG. 7. The top portion of the vertical interconnects 226 can be dipped into the bath 1080 to apply a layer or coating of the material used to the interconnect cap 770.

Figure 11:
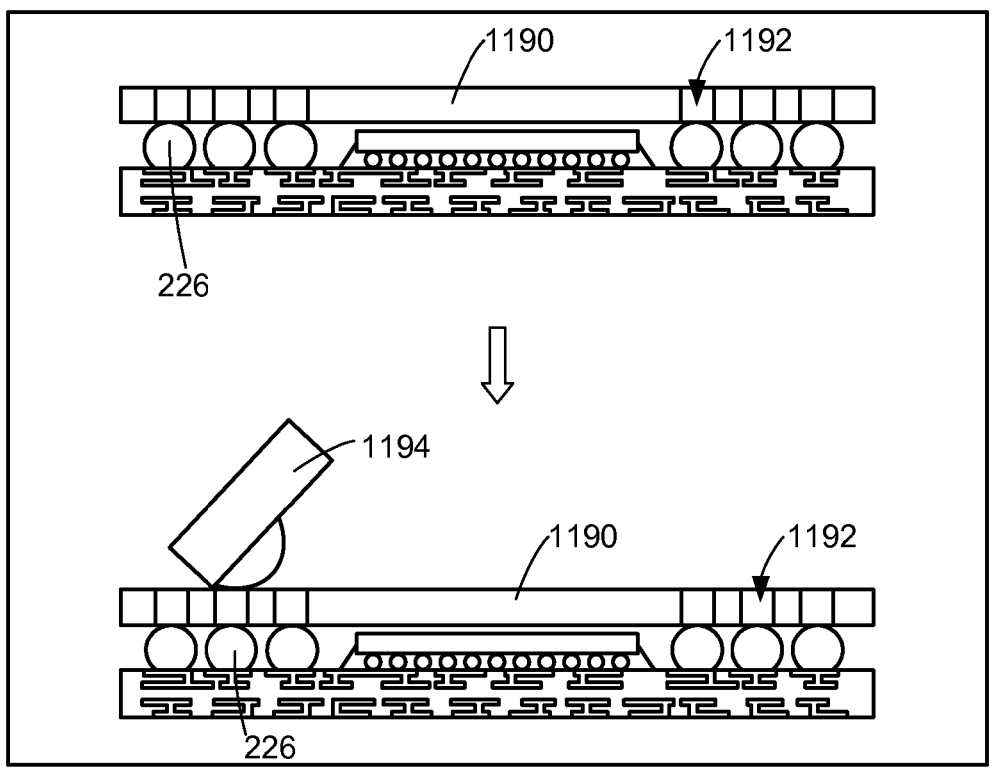
FIG. 11 is a second example in forming the interconnect cap of FIG. 7.

Referring now to FIG. 11, therein is shown a second example in forming the interconnect cap 770 of FIG. 7. The second example depicts a mask frame 1190 over the structure of FIG. 6. The mask frame 1190 is defined as a mask or cover having openings to expose portions structures or objects below the mask frame 1190.

The mask frame 1190 can have mask openings 1192. The mask openings 1192 can expose the top portion of the vertical interconnects 226

A material dispenser 1194 can apply the material used to form the interconnect cap 770 of FIG. 6. The material dispenser 1194 is defined as an instrument for applying or placing material. For example, the material dispenser 1194 can be a stencil or a needle dispenser.

The material dispenser 1194 can apply the material used to form the interconnect cap 770 through the mask openings 1192 to cover the interconnect cap 770. The material used to form the interconnect cap 770 can be a high viscosity liquid or a paste.

Figure 12:
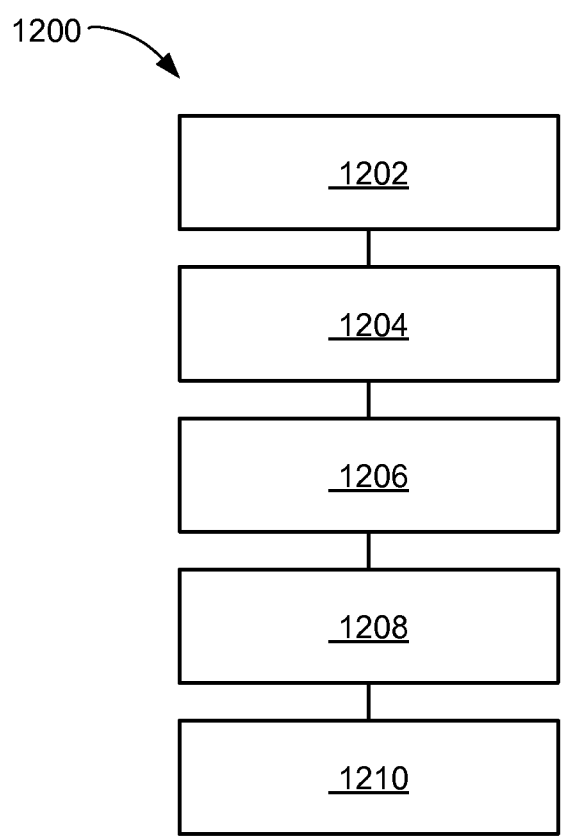
FIG. 12 is a flow chart of a method of manufacture of the integrated circuit packaging system in an embodiment of the present invention.

Referring now to FIG. 12, therein is shown a flow chart of a method 1200 of manufacture of the integrated circuit packaging system 100 in a further embodiment of the present invention. The method 1200 includes: providing a substrate in a block 1202; attaching an integrated circuit to the substrate in a block 1204; attaching a vertical interconnect over the substrate in a block 1206; forming an encapsulation on the substrate and covering the vertical interconnect in a block 1208; and forming a rounded cavity, having a curved side, in the encapsulation with the vertical interconnect exposed in the rounded cavity in a block 1210.

Thus, it has been discovered that the integrated circuit packaging system of the present invention furnishes important and heretofore unknown and unavailable solutions, capabilities, and functional aspects for interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
  providing a substrate;
  attaching an integrated circuit to the substrate;
  attaching a vertical interconnect having a convex top portion over the substrate, wherein the vertical interconnect having characteristics of removal of an interconnect cap of a material different from the vertical interconnect;
  forming an encapsulation, on the substrate, having an encapsulation top side exposed above the convex top portion of the vertical interconnect; and forming a rounded cavity in the encapsulation, between the encapsulation top side and the vertical neck wherein the rounded cavity includes a cavity opening at the encapsulation top side, the cavity opening directly above the convex top portion of the vertical interconnect, exposing the convex top portion of the vertical interconnect through the cavity opening.

2. The method as claimed in claim 1 wherein forming the rounded cavity in the encapsulation includes:
applying the interconnect cap on the vertical interconnect; and
removing the interconnect cap to expose the vertical interconnect.

3. The method as claimed in claim 1 wherein forming the rounded cavity includes forming the rounded cavity having a cavity width greater than an opening width, of the rounded cavity, at the encapsulation top side.

4. The method as claimed in claim 1 wherein attaching the integrated circuit includes attaching a circuit non-active side of the integrated circuit to the substrate.

5. The method as claimed in claim 1 wherein attaching the vertical interconnect includes attaching the vertical interconnect laterally adjacent to the integrated circuit.

6. A method of manufacture of an integrated circuit packaging system comprising:
providing a substrate;
attaching an integrated circuit to the substrate;
attaching a vertical interconnect having a convex top portion over the substrate, wherein the vertical interconnect having characteristics of removal of an interconnect cap of a material different from the vertical interconnect;
forming an encapsulation, having an encapsulation top side facing away from the substrate, on the substrate and covering the vertical interconnect; and
forming a rounded cavity in the encapsulation, between the encapsulation top side and the vertical interconnect, wherein the rounded cavity includes a cavity opening at the encapsulation top side, the cavity opening directly above the convex top portion of the vertical interconnect, exposing the convex top portion of the vertical interconnect through the cavity opening.

7. The method as claimed in claim 6 wherein forming the rounded cavity includes exposing the convex top portion of the vertical interconnect above a horizontal plane of a circuit non-active side of the integrated circuit.

8. The method as claimed in claim 6 wherein forming the convex top portion of the vertical interconnect exposed in the rounded cavity below the encapsulation top side.

9. The method as claimed in claim 6 wherein attaching the vertical interconnect includes attaching the vertical interconnect to a side of the substrate facing away from the integrated circuit.

10. The method as claimed in claim 6 wherein providing the substrate includes providing an active substrate having a through silicon via.

11. An integrated circuit packaging system comprising:
a substrate;
an integrated circuit attached to the substrate;
a vertical interconnect having a convex top portion over the substrate, the vertical interconnect having characteristics of removal of an interconnect cap of a material different from the vertical interconnect; and
an encapsulation, on the substrate, includes an encapsulation top side exposed above the convex top portion of the vertical interconnect, wherein the encapsulation has a rounded cavity between the encapsulation top side and the vertical interconnect including a cavity opening at the encapsulation top side, the cavity opening directly above the convex top portion of the vertical interconnect, and the convex top portion of the vertical interconnect exposed through the cavity opening.

12. The system as claimed in claim 11 wherein a curved side of the rounded cavity and an exposed portion of the vertical interconnect have the characteristics of the interconnect cap removed.

13. The system as claimed in claim 11 wherein the encapsulation having the rounded cavity includes a cavity width greater than an opening width at the encapsulation top side.

14. The system as claimed in claim 11 wherein the integrated circuit includes a circuit non-active side attached to the substrate.

15. The system as claimed in claim 11 wherein the vertical interconnect is laterally adjacent to the integrated circuit.

16. The system as claimed in claim 11 wherein the encapsulation includes:
the encapsulation top side facing away from the substrate; and
the rounded cavity having the cavity opening at the encapsulation top side.

17. The system as claimed in claim 16 wherein the exposed portion of the vertical interconnect in the rounded cavity is above a horizontal plane of the circuit non-active side of the integrated circuit.

18. The system as claimed in claim 16 wherein the exposed portion of the vertical interconnect in the rounded cavity is below a horizontal plane of the encapsulation top side.

19. The system as claimed in claim 16 wherein the vertical interconnect is attached to a side of the substrate facing away from the integrated circuit.

20. The system as claimed in claim 16 wherein the substrate is an active substrate having a through silicon via.

* * * * *

UNITED STATES PATENT AND TRADEMARK OFFICE
CERTIFICATE OF CORRECTION

| | | |
|---|---|---|
| PATENT NO. | : 9,093,364 B2 | Page 1 of 1 |
| APPLICATION NO. | : 13/166438 | |
| DATED | : July 28, 2015 | |
| INVENTOR(S) | : Pagaila | |

It is certified that error appears in the above-identified patent and that said Letters Patent is hereby corrected as shown below:

In the Claims:

Column 15, Claim 1, line 2, delete "vertical neck" and insert therefor --vertical interconnect--

Signed and Sealed this
Fifth Day of April, 2016

Michelle K. Lee
*Director of the United States Patent and Trademark Office*